United States Patent [19]

Sonobe et al.

[11] Patent Number: 5,049,921
[45] Date of Patent: Sep. 17, 1991

[54] SHEET CARTRIDGE AND IMAGE RECORDING APPARATUS USING THE SHEET CARTRIDGE

[75] Inventors: Katsuyoshi Sonobe; Tatsuya Shindo, both of Nagoya; Yoshiya Tomatsu, Ichinomiya; Hideo Nishigaki, Nagoya; Kenji Sakakibara, Ichinomiya; Yumio Matsumoto, Kasugai; Eiji Shibata, Nagoya, all of Japan

[73] Assignee: Brother Kogyo Kabushiki Kaisha, Japan

[21] Appl. No.: 470,900

[22] Filed: Jan. 26, 1990

[30] Foreign Application Priority Data

| Jan. 30, 1989 | [JP] | Japan | 1-20503 |
| Jan. 31, 1989 | [JP] | Japan | 1-10583[U] |
| Jan. 31, 1989 | [JP] | Japan | 1-21767 |
| Feb. 20, 1989 | [JP] | Japan | 1-39965 |
| Apr. 6, 1989 | [JP] | Japan | 1-87240 |

[51] Int. Cl.$^5$ ............................................. G03B 27/32
[52] U.S. Cl. ............................................. 355/27; 355/72
[58] Field of Search .................... 355/27, 28, 72-76; 354/275, 277; 242/67.2, 67.3 R, 71.6, 71, 71.1

[56] References Cited

U.S. PATENT DOCUMENTS

| 4,034,929 | 7/1977 | Ebner, Jr. | 242/71.1 |
| 4,566,785 | 1/1986 | Takenouchi | 355/72 |
| 4,914,479 | 4/1990 | Ogura et al. | 355/72 |

Primary Examiner—Brian W. Brown
Assistant Examiner—Khanh Dang
Attorney, Agent, or Firm—Oliff & Berridge

[57] ABSTRACT

An image recording apparatus having a sheet cartridge in which a rolled photosensitive recording medium is accommodated. The sheet cartridge has a sheet retaining device for preventing the recording medium from being retracted into a cartridge casing. The retaining device also provides a light shielding member. The image recording apparatus also includes structure for preventing the cartridge from being removed in a case where a residual recording medium is still rolled in the cartridge casing. The image recording apparatus is provided with a wiper member for removing dusts deposited on a surface of a feed roller. Further, a sensor element is provided for detecting non-rotation of a takeup shaft or a slack of the recording medium.

27 Claims, 9 Drawing Sheets

SHEET CARTRIDGE AND IMAGE RECORDING APPARATUS USING THE SHEET CARTRIDGE

BACKGROUND OF THE INVENTION

The present invention relates to an image recording apparatus for recording an image on an image recording medium and to a sheet cartridge assembled in the image recording apparatus and accommodating therein the image recording medium.

Various types of image recording apparatus have been known for recording an image on an image recording medium. Among these, one conventional image recording apparatus employs an elongated web-like image recording medium which is rolled and accommodated in a sheet cartridge. The image recording medium comprises a photosensitive recording medium, and therefore, the sheet cartridge per se is normally maintained in light-shielded fashion. When installing the sheet cartridge into the image recording apparatus, the elongated photosensitive recording medium is pulled out of the cartridge and the medium is installed on a predetermined sheet path of the apparatus and is wound over a takeup shaft.

When the image recording medium in the cartridge is wholly exhausted, the cartridge is replaced for a new cartridge by an operator. Therefore, easy replacement work must be required in the sheet cartridge. Further, after assembly of the new cartridge and after installation of the image recording medium at the predetermined sheet path defined in the image recording apparatus, the installed image recording medium must be smoothly transferred along the sheet path, otherwise sheet slacking or jamming may occur.

With the above general matter in view, in the conventional sheet cartridge which accommodates therein the rolled image recording medium, a shielding member is provided at an opening of a cartridge casing for preventing the internal image recording medium from being exposed to light prior to the assembly of the cartridge into the image recording apparatus. Further, a leader portion is provided at a leading end portion of the image recording medium so as to properly direct the image recording medium in the sheet path of the image recording apparatus, and the leader portion is slightly protruded out of the opening for pulling the sheet out of the cartridge casing.

Further, in the conventional sheet cartridge a back tension or braking force is applied to the elongated image recording medium so as to provide a proper tension to the medium in traveling along the sheet path. Therefore, in the sheet cartridge prior to the assembly into the apparatus, the leader portion is provided with a locking pawl which prevents the protruded leader portion from being retracted into the cartridge casing. When the leader tape is wound over the takeup shaft, the subsequent image recording medium can not be further retracted into the sheet cartridge casing. Thereafter, a mechanism for removing the locking pawl is actuated, so that the locking pawl is out of contact with the image recording medium.

With such a conventional sheet cartridge, after assembly of the sheet cartridge into the apparatus, the light shielding member must be removed. In this case, since the back tension is applied to the rolled image recording medium, the protruded leader portion must be manually gripped so as to prevent the medium from being retracted into the cartridge casing. Therefore, smooth handling to the sheet cartridge may not be attainable in the conventional cartridge. If the operator erroneously releases the external leader portion, the leader portion may be retracted into the casing due to the applied back tension. If the cartridge is intended to be used, the cartridge must be subjected to disassembly in a dark room.

Further, in the conventional image recording medium using the elongated image recording medium accommodated in the sheet cartridge, the cartridge is simply mounted at a proper location in the apparatus, and neither means for fixing the cartridge at a position nor means for releasing the fixing means are provided in the apparatus. Therefore, the operator can easily remove the cartridge from the apparatus. However, when the cartridge is removed from the image recording apparatus while non-used image recording medium is still rolled in the sheet cartridge, the mechanism for releasing the locking pawl is rendered inoperable, and the free locking pawl may be brought into contact with the image recording medium, to thereby damage an image recorded thereon.

As described above, the image recording medium in the sheet cartridge is subjected to back tension or a braking force so as to provide a proper tension to the medium when it is running along the sheet path. More specifically, the elongated image recording medium is wound over a supply shaft extending through the cartridge casing, and a frictional braking force is applied to the shaft. In this case, if a low frictional force is applied, sheet overrunning may occur due to inertial force of the sheet roll. Therefore, sheet slacking may occur in the sheet path, and image recording operation may be degraded. On the other hand, if excessive frictional force is applied to the supply shaft, the image recording medium may be torn or cut due to excessive tension applied thereto. To avoid this problem, in the conventional sheet cartridge, the size of the cartridge casing and the flanges of the supply shaft are precisely determined, so as to provide a substantially constant frictional force between the casing and the flange.

However, it would be rather difficult to provide such casing and flanges having high dimensional accuracy, and dimensional error may lead to the non-uniformity of the frictional force. As a result, improper imaging may be provided and yieldability may be lowered.

In still another aspect in the conventional image recording apparatus, the image recording medium is traveled along the sheet path defined by sheet transferring means such as sheet feed rollers. The image recording medium sup plied from the sheet cartridge is directed toward an exposure zone and a pressure developing unit by means of rollers. However, during this transfer, if dust or foreign objects attached to the surface of the image recording medium is transferred or translated into a peripheral surface of the feed roller and the transferred dust is deposited thereon, the coefficient of friction provided by the roller surface may be changed, and accordingly, the image recording medium is not smoothly delivered toward the exposure zone and the pressure developing unit. Consequently, multiple light exposures may occur, or a distance between the neighboring images on the recording medium may be improperly elongated. Further, if the image recording medium in the cartridge is a photosensitive pressure sensitive recording medium, it would be almost impossible to provide a proper positional alignment with a developer medium at the pressure developing unit, and the resultant output image may be degraded.

In another aspect in the conventional image recording apparatus, if the sheet transferring means is operated while the rotation of the takeup shaft is terminated or suspended, a sheet slack occurs at a sheet path portion immediately upstream of the takeup means. If such slackened sheet medium is again involved in the rotating rollers, sheet jamming may occur. Normally, such sheet jamming cannot be easily cleared by simply pulling the sheet medium. To correct this jamming, the image recording apparatus must be disassembled, and the jammed sheet cut into pieces, and the rollers involving the jammed sheet must be removed. For an ordinary operator, it would be rather difficult to deal with such sheet jamming.

SUMMARY OF THE INVENTION

It is therefore, an object of the present invention to overcome the above described drawbacks and disadvantages and to provide an improved image recording apparatus and a sheet cartridge for assembly into the apparatus.

Another object of the invention is to provide the improved sheet cartridge, in which an image recording medium accommodated in the cartridge is easily pulled out and installed at a sheet path of the image recording apparatus, and stabilized travel of the image recording medium is attained in the sheet path.

Still another object of the invention is to provide the sheet cartridge which is capable of light shielding an internal rolled image recording medium and preventing a leading end portion of the medium from being retracted into a cartridge casing.

Still another object of the invention is to provide a mechanism for preventing the sheet cartridge from being removed when a residual image recording medium is still rolled in the cartridge and for allowing the cartridge to be detached from the apparatus when the entire image recording medium in the cartridge is exhausted.

Still another object of the present invention is to provide a sheet cartridge which provides constant frictional braking force relative to the travel of the image recording medium fed from the cartridge.

Still another object of the invention is to provide the image recording apparatus in which stabilized sheet travel is attained in the sheet path by providing a wiper means for wiping a sheet feed roller.

Still another object of the invention is to provide the image recording apparatus provided with a sensor means for detecting non-rotation of a takeup shaft or for detecting a sheet slack and for stopping the operation at an early stage of malfunction, to thereby minimize sheet slackening or jamming, to thus provide a smooth sheet transfer along the sheet path.

These and other objects of the present invention will be attained by providing an image recording apparatus for recording an image on an image recording medium, the image corresponding to an image of an original, the image recording apparatus comprising a frame, a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening, an exposure stand positioned of the sheet cartridge and at which a part of the image recording medium is exposed to light for providing a latent image corresponding to the image of the original, a pressure developing unit positioned of the exposure stand for pressure developing the latent image and for providing a visible image, a first sheet transferring means defining a first sheet path for feeding the image recording medium to the pressure developing unit, a takeup means for winding therearound the light exposed image recording medium, and a second sheet transferring means defining a second sheet path for feeding the image recording medium to the takeup means.

In another aspect of the invention, there is provided a sheet cartridge which stores therein a rolled photosensitive recording medium, the recording medium having a leading end portion and being fed out of the cartridge along a sheet path, the cartridge comprising a cartridge casing for accommodating therein the rolled photosensitive recording medium, the casing being formed with an opening through which the photosensitive recording medium is drawn out of the casing; and the retaining means being connectable to the leading end portion of the image recording medium to avoid retraction of the medium into the cartridge casing and for covering the opening, the retaining means comprising locking means foldable into two halves and sandwiching the leading end portion of the image recording medium for connecting the halves to the medium in its folding state, the locking means providing a folded edge line, and light shielding means provided integral with the locking means, the folded edge line being positioned ahead of the shielding means with respect to a running direction of the image recording medium along the sheet path.

In still another aspect of the present invention, there is provided an image recording apparatus provided with a frame and a sheet cartridge which includes a cartridge casing in which a rolled image recording medium is accommodated, the apparatus comprising fixing means for fixing the sheet cartridge casing at a position, the fixing means being supported by the frame, releasing means for moving the fixing means to remove the sheet cartridge casing from the frame, a first detecting means for detecting non-existence of the rolled image recording medium in the cartridge casing, the first detecting means generating a first output signal indicative of the non-existence of the image recording medium in the cartridge casing, and control means for actuating the releasing means in response to the first output signal.

In still another aspect of the present invention, there is provided an image recording apparatus comprising a frame, a sheet cartridge for accommodating therein a rolled image recording medium; the cartridge comprising a cartridge casing, a supply shaft rotatably supported by the cartridge casing and extending therethrough, the supply shaft having a first distal end face and a second distal end face, the image recording medium being wound over the supply shaft in the rolled state, and a cartridge support means provided at the frame, the cartridge support means comprising a first wall having a first inner surface; a second wall having a second inner surface: a friction member provided at the first inner surface, the first distal end face being in frictional contact with the friction member; and an urging member disposed at the second inner surface, the second distal end face being in contact with the urging member for urging the supply shaft in its axial direction toward the friction member.

In still another aspect of the present invention, there is provided an image recording apparatus comprising a sheet cartridge in which a rolled image recording medium is accommodated, a pressure developing unit positioned downstream of the sheet cartridge, a first sheet transferring means which defines a first sheet path and is positioned between the sheet cartridge and the pressure developing unit, the first sheet transferring means comprising a drive roller and a nip roller for pulling out the image recording medium from the sheet cartridge and for introducing and feeding the medium into and along the first sheet path, a chute means which defines a part of the first sheet path, a resilient member attached to the chute means, and a wiper member attached to the resilient member, the drive roller being in rolling slide contact with the wiper member.

DETAILED DESCRIPTION OF THE PREFERRED EMBODIMENTS

Figure 1:
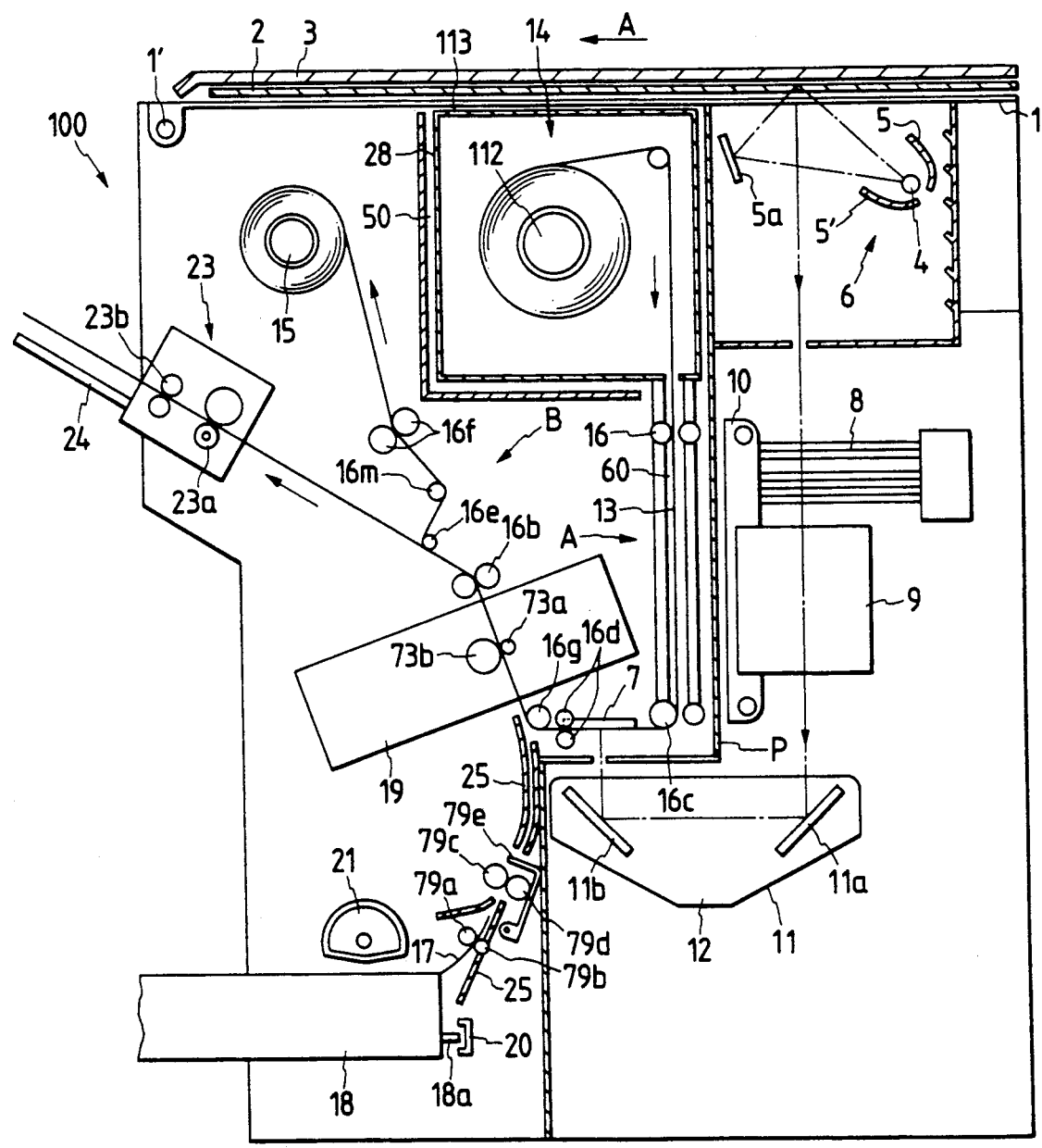
FIG. 1 is a schematic cross-sectional side view showing an image recording apparatus according to the present invention.

FIG. 1 shows one example of an image recording apparatus 100 which uses a photosensitive pressure sensitive recording medium. The image recording apparatus has a frame defining an internal housing having a box shape. The frame has an upper opening covered with an upper plate 1 pivotally supported by a pivot shaft 1' to the upper end portion of the frame. A glass plate 2 for mounting thereon an original and an original cover plate 3 for covering the glass plate 2 are disposed over the upper plate 1. The glass plate 2 and the cover plate 3 are movable in a horizontal direction for moving the original mounted on the glass plate 2 in a direction indicated by an arrow A during an exposure operation.

Within the internal space of the housing, a partitioning wall P extends in a vertical direction. The partitioning wall P divides the internal space into an optical section and a second section which includes an exposure zone and a pressure developing unit so as to prevent light in the optical section from leaking into the second section except at the exposure zone. A light source 6 such as a halogen lamp 4 is provided below the glass plate 2. The halogen lamp 4 is of an elongated shape extending in a direction perpendicular to the traveling direction of the original and in widthwise direction thereof. A pair of upper and lower reflection mirrors 5 and 5' are provided adjacent the halogen lamp 4 so as to direct light from the lamp 4 toward the glass plate 2. Further, a reflector 5a is provided in confronting relation with the halogen lamp 4. The reflector 5a is adapted to reflect toward the original, those lights being not initially directed toward the original from the lamp 4.

Below the light source 4, a filter unit 8 and a lens unit 9 are provided. The filter unit 8 is adapted for changing a light transmissive characteristic in accordance with a photosensitivity of a photosensitive pressure sensitive sheet 13 serving as an image recording medium in order to control a color tone of an output image. The lens unit 9 is provided below the filter unit 8. The light reflected from the original enters into the lens unit 9 through the filter unit 8.

An exposure stand 7 is provided at a center portion of the housing frame. The light condensed by the lens unit 9 is focused on the photosensitive pressure sensitive sheet 13 on the exposure stand 7 by way of a mirror unit 11 disposed below the lens unit 9. The mirror unit 11 includes a first mirror 11a and a second mirror 11b. The light passing through the lens unit 9 is subjected to directional change by 180 degrees by the mirrors 11a and 11b, the latter being positioned immediately below the exposure zone for exposing the photosensitive pressure sensitive sheet 13 at the exposure zone to the light. In the above described embodiment, the optical components such as the halogen lamp 4, the filter unit 8, the lens unit 9 and the mirror unit 11 constitute an exposure means, and these optical components are positioned within an optical section provided by the partitioning wall P. The lens unit 9 and the mirror unit 11 are vertically movable so as to change image magnification by a plurality of stages.

The photosensitive pressure sensitive sheet 13 includes a plurality of microcapsules coated on a base, each microcapsule encapsulating therein a photosensitive resin which is photo-curable upon light exposure, a chromogenic material and a polymerization initiator. The photosensitive pressure sensitive sheet 13 is of an elongated shape and is rolled over a supply shaft 112. The rolled photosensitive pressure sensitive sheet 13 is positioned in a casing 28. A combination of the rolled photosensitive sheet 13, the shaft 112 and the casing 28 is referred to as a sheet cartridge 14. The casing 28 is removably mounted on and cartridge support means 50.

Further, a feed roller 16, a guide roller 16c, a transfer rollers 16d are provided for feeding the sheet 13 toward a pressure developing unit 19 having a small diameter roller 73a and a backup roller 73b. A dancer roller 16g is provided at downstream of the exposure stand 7 for guiding the light-exposed photosensitive pressure sensitive sheet 13 toward the pressure developing unit 19 and for absorbing a sheet slack. These rollers are driven by a single drive motor (not shown) and are referred to as a first sheet transferring means (positioned upstream of the pressure developing unit). The photosensitive sheet 13 supplied from the cartridge 14 and directed toward the exposure table 7 is prevented from light exposure by the partitioning wall P.

Further, a pair of feed rollers 16b, a separation roller 16e, a meandering travel controlling roller 16m, and another pair of feed rollers 16f are provided so as to direct the photosensitive pressure sensitive sheet 13 toward a takeup shaft 15. These rollers positioned downstream of the pressure developing unit 19 are driven by another single drive motor (not shown) and are referred to as a second sheet transferring means. In the second sheet transferring means, various roller arrangements may be conceivable other than those shown in FIG. 1.

The feed speed of the microcapsule sheet 13 is set equal to the moving speed of the glass plate 2. Therefore, a linear line latent image is successively formed line by line on the photosensitive pressure sensitive sheet 13 at the exposure stand 7 in synchronism with the movement of the glass plate 2. Incidentally, a sensor means is provided adjacent the takeup shaft for detecting rotation phase thereof.

At a position below the pressure developing unit 19, a developer sheet cassette 18 is provided for storing therein a stack of developer sheets 17. A projection 18a is provided at the developer sheet cassette 18 whose configuration is indicative of a size or a type of the sheet 17. Further, an acknowledgement means 20 is provided in the frame housing so as to determine the configuration of the projection 18, to thus acknowledge the side or type of the developer sheet 17.

The developer sheet 17 includes a base, a developer material coated thereover, which developer material can provide a chromogenic reaction with the chromogenic material in the microcapsules of the photosensitive sheet 13, and a thermal melting resin layer coated over the developer material layer. The base may be made of a paper having small thermal capacity, or PET (polyethylene terephthalate) having large thermal capacity.

A sector roller 21 is provided immediately above the developer sheet cassette 18 for delivering an uppermost developer sheet toward the pressure developing unit 19.

Further, a pair of guide plates 25 are provided for guide travel of the developer sheet 17, and a feed roller 79a and a pinch roller 79b are provided for feeding the developer sheet 17 to the pressure developing unit 19. The developer sheet 17 and the light-exposed photosensitive pressure sensitive sheet 13 are superposed with each other at an inlet portion of the pressure developing unit 19 for undergoing pressure developing operation by the small diameter roller 73a and the backup roller 73b.

Developer sheet rollers 79c, 79d are provided, and a resist gate 79e is provided at a position downstream of these rollers 79c, 79d so as to control the feed timing of the developer sheet 17. That is, the resist gate 79e is adapted to align a leading edge of the developer sheet 17 with a leading end portion of the light-exposed portion of the photosensitive pressure sensitive sheet 13 at the inlet portion of the pressure developing unit 19. The resist gate 79e is normally positioned of to prevent the developer sheet 17 from being delivered toward the pressure developing unit 19. The developer sheet 17 delivered from the sheet cassette 18 by the sector roller 21 is brought into abutment with the resist gate 79e by the feed rollers 79c, 79d. The developer sheet 17 is thus subjected to positional alignment by aligning the leading edge thereof with the resist gate 79e. Thereafter, the resist gate 79e is moved to its retracted position so that the leading edge of the developer sheet 17 will be brought into alignment with the leading end of the light exposed portion of the photosensitive sheet 13. Incidentally, instead of the sector roller 21, a suction means is also available which attracts the uppermost sheet by a negative pressure so as to use section to introduce the sheet 17 toward the developer sheet path defined by the guide plates 25.

The pressure developing unit 19 includes the small diameter pressure roller 73a and a large diameter backup roller 73b. A rotation axis of the large diameter roller 73b is stationarily positioned whereas the small diameter roll 73a is provided to be movable toward and away from the large diameter roller 73b. Upon pressure application to the superposed sheets 13 and 17, non-light exposed microcapsules of the sheet 13 are ruptured, so that chromogenic material contained in the microcapsules are reacted with the developer material of the developer sheet 17 for generating a color image.

A thermal fixing unit or heating unit 23 is provided downstream of the pressure developing unit 19. The heating unit 23 includes a heat roller 23a adapted to heat the developer sheet 17 which has been subjected to the pressure developing operation, to thereby provide a gloss output image. Further, a pair of feed rollers 23b are disposed in the heating unit 23 for feeding the thus heated developer sheet 17, and discharging the latter outside the heating unit. A discharge tray 24 is provided for receiving the developer sheet 17.

In operation, upon depression of a start button (not shown), the original support glass plate 2 is moved in one direction (rightwardly in FIG. 1), so that a left side edge of the original is brought into confrontation with the halogen lamp 4. Then, the glass plate 2 is moved in an opposite direction (leftwardly in FIG. 1) during which the original is subjected to light irradiation. During this period, the microcapsule sheet 13 is moved toward the takeup shaft 25 at a speed equal to the moving speed of the original support glass plate 2. Therefore, a line latent image is successively same to light reflected from the original. The developer sheet 17 is also transferred toward the pressure developing unit 19 in synchronism with the leftward movement of the original support glass plate 2, and is superposed with the latent image portion of the microcapsule sheet. These sheets are pressed together at the pressure developing unit 19 for providing a color output image on the developer sheet 17, and the output image is thermally fixed at the thermal fixing unit 23, and the developer sheet 17 is then discharged onto the discharge tray 24.

Next, details of the sheet cartridge 14 will be described with reference to FIGS. 1 thru 4. The structure of the sheet cartridge 14 facilitates installation of the microcapsule sheet 13 into the sheet path given by the above described first and second sheet transferring means, and particularly for facilitating pulling the leading end portion of the microcapsule sheet 13 from the cartridge case 28 against biased retraction of the microcapsule sheet thereinto.

Figure 2:
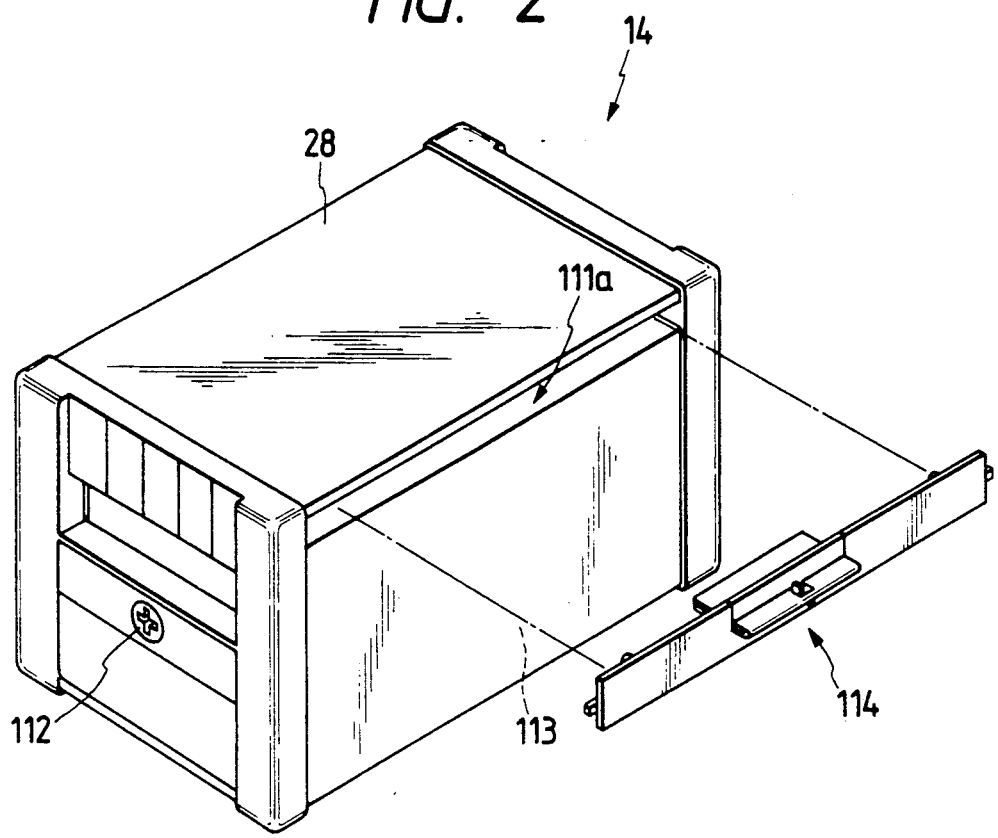
FIG. 2 is a perspective view showing a sheet cartridge according to the present invention and assembled into the image recording apparatus.
Figure 3:
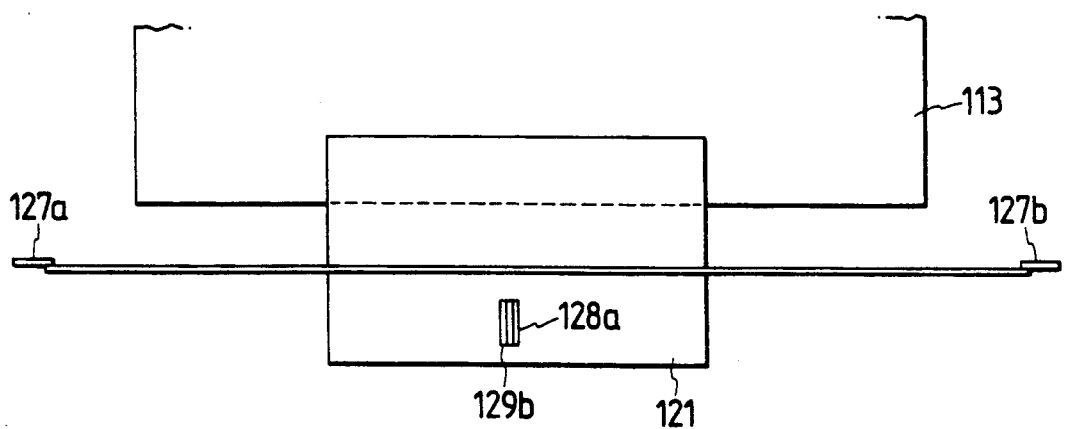
FIG. 3 is a partial top view showing a retaining means in the sheet cartridge according to this invention.

As described above, the sheet cartridge 14 includes the cartridge casing 28 in which the supply shaft 112 is provided. Over the supply shaft 112, the photosensitive pressure sensitive recording sheet such as the microcapsule sheet 13 is wound, whose leading end portion is provided with a leader portion 113 as shown in FIG. 2. The cartridge casing 28 is formed with an opening 111a through which the leader portion 113 extends. As shown in FIG. 3, the leader portion 113 has a part protruding out of the casing 28, and the part is provided with a retaining means 114 for preventing the leader portion 113 from being retracted into the cartridge casing 28.

Figure 4:
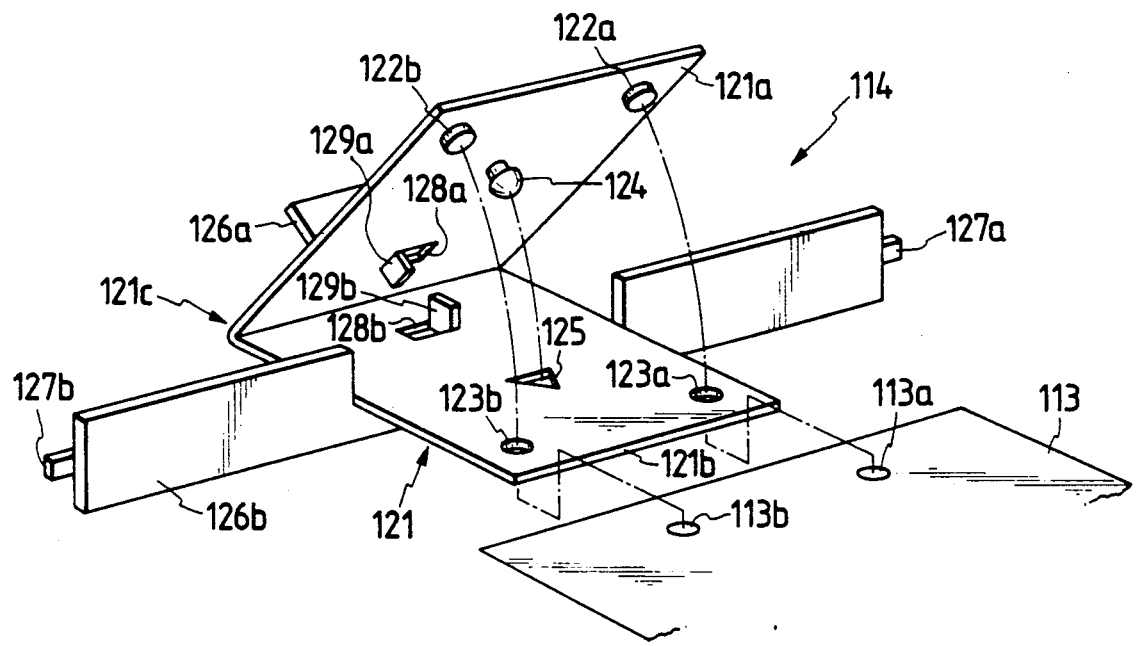
FIG. 4 is a perspective view showing the retaining means engageable with a leading end portion of an image recording medium.

The retaining means 114 is best shown in FIG. 4. The retaining means 114 has a locking member 121 which is foldable into two halves 121a and 121b so as to sandwich a leading end portion of the leader portion 113 therebetween. (In FIG. 4, an open state of locking member 121 is shown for the purpose of better understanding). The upper folded half 121a of the locking member 121 is provided with two projections 122a,122b extending toward the lower folded half 121b, and the lower folded half 121b is formed with two holes 123a,123b, those which are engageable with the corresponding projections 122a,122b upon complete folding. Further, the leading end portion of the leader portion 113 is formed with two through-holes 113a,113b. The two projections 122a,122b extend through the through-holes 113a,113b and are engaged with the holes 123a,123b, so that the leader portion 113 is coupled to the locking member 121.

Further, the upper folded half 121a of the locking member 121 is provided with a spherical projection 124 extending toward the lower folded half 121b, whereas the latter is formed with a triangular hole 125 which is snap-fittable with the spherical projection 124. Upon snap fitting between the spherical projection 124 and the triangular hole 125, the confronting folded halves 121a and 121b are locked together to securely couple the leader portion 113 thereto.

The upper folded half 121a has an upper surface provided with a first light shielding plate 126a protruding upwardly and extending in a direction parallel with the opening 111a. Further, the lower folded half 121b of the locking member 121 is provided with a second light shielding plate 126b extending in parallel with the opening 111a. When the upper and lower folded halves 121a and 121b are superposed together upon folding, these first and second light shielding plates 126a and 126b are flush with each other to provide a rectangular shielding member whose area is larger than an area of the opening 111a, and which is positioned to completely cover the opening 111a. With such an arrangement, the leader portion 113 is prevented from being retracted into the cartridge casing 28 against a biasedly retracting force applied to the rolled microcapsule sheet 13. Further, the rolled microcapsule sheet 13 in the casing 28 is protected against light exposure because of the combined light shielding plates 126a and 126b. In order to securely position the light shielding member, a pair of pawls 127a and 127b are provided at the lateral end portions of the second light shielding plate 126b. The pawls 127a and 127b may be engageable with any latching means or holes (not shown) provided on the cartridge support means 50 or on the side walls of the cartridge casing 28.

The folded edge line of the locking member 121 is positioned at the most leading side thereof. The edge line is positioned frontwardly with respect to the shielding member so as to provide a hand holding portion 121c. In the hand holding portion 121c and at upper and lower folded halves 121a and 121b, cut-bent portions 129a and 129b are provided. More specifically, the upper folded half 121a is subjected to three-cutting so as to bend the cut part toward the lower folded half 121b to thus provide a cut projection 129a and to provide a cut-away hole 128a. On the other hand, the lower folded half 121b is subjected to three-cutting so as to bend the cut part toward the upper folded half 121b to thus provide a cut projection 129b and to provide a cut-away hole 128b. The cut projection 129a is engageable into the cut-away hole 128b, whereas the cut projection 129b is engageable with the cut-away hole 128a when the folded halves are completely superposed with each other. If an operator pushes the cut projections 129a and 129b, the superposed upper and lower folded halves 121a and 121b are opened about the folded edge line against the snapped engagement between the spherical projection 124 and the triangular hole 125.

With this structure, the rolled microcapsule sheet 13 and the major part of the leader portion 113 are completely stored within the cartridge casing 28 because of the biased rotation of the cartridge shaft 112. In this case, the light shielding plates 126a and 126b cover the opening 111a of the casing 28, and therefore, photosensing of the microcapsule sheet 13 within the cartridge case 28 can be avoided In assembling the cartridge 14 into the image recording apparatus 100, and installation of the microcapsule sheet 13 over the sheet path being intended, the leader portion 113 is urged to be retracted into the casing 28 because of the back tension applied to the cartridge shaft 112 (this back tension is applied by a mechanism provided in the housing frame of the image recording apparatus). However, since the leader portion 113 is coupled to the retaining means, the leader portion 113 is prevented from being completely retracted into the casing 28. Therefore, the operator holds the hand holding portion 121c, and pulls out the leader portion 113 from the cartridge casing 28. The thus pulled out leader portion 113 is then installed at a predetermined sheet path defined by the first and second sheet transferring means. Setting of the leader portion 113 at a proper sheet path can be made by the nipping force of the rollers constituting the first and second transferring means. Upon completion of the setting, the projecting portions 129a and 129b are manually pressed in opposite directions, so that the folded halves 121a and 121b of the locking means 121 are opened. Consequently, the locking means 121 can be separated from the leader portion 113, and as a result the retaining means 114 is separated therefrom. Because of the provision of the retaining means 114, the retraction of the leader portion 113 into the cartridge casing 28 due to the back tension applied to the cartridge shaft 112 can be obviated, and therefore, the microcapsule sheet 13 can be smoothly installed at the sheet path. Further, light leakage into the casing 28 is avoided by the shielding members 126a and 126b during a non service the cartridge 14.

Next, in the image recording apparatus 100 according to the present invention, another improvement has been made on the installation of the sheet cartridge 14. That is, a mechanism is provided for preventing the sheet cartridge 14 from being removed from the cartridge support means 50 if available microcapsule sheet 13 is still rolled or contained in the cartridge casing 28. That is, the mechanism only allows the sheet cartridge 14 to be detached from the cartridge support means 50 when the entire rolled microcapsule sheet 13 is exhausted. This cartridge removal preventing mechanism will be described with reference to FIGS. 1, 5 and 6.

Figure 5:
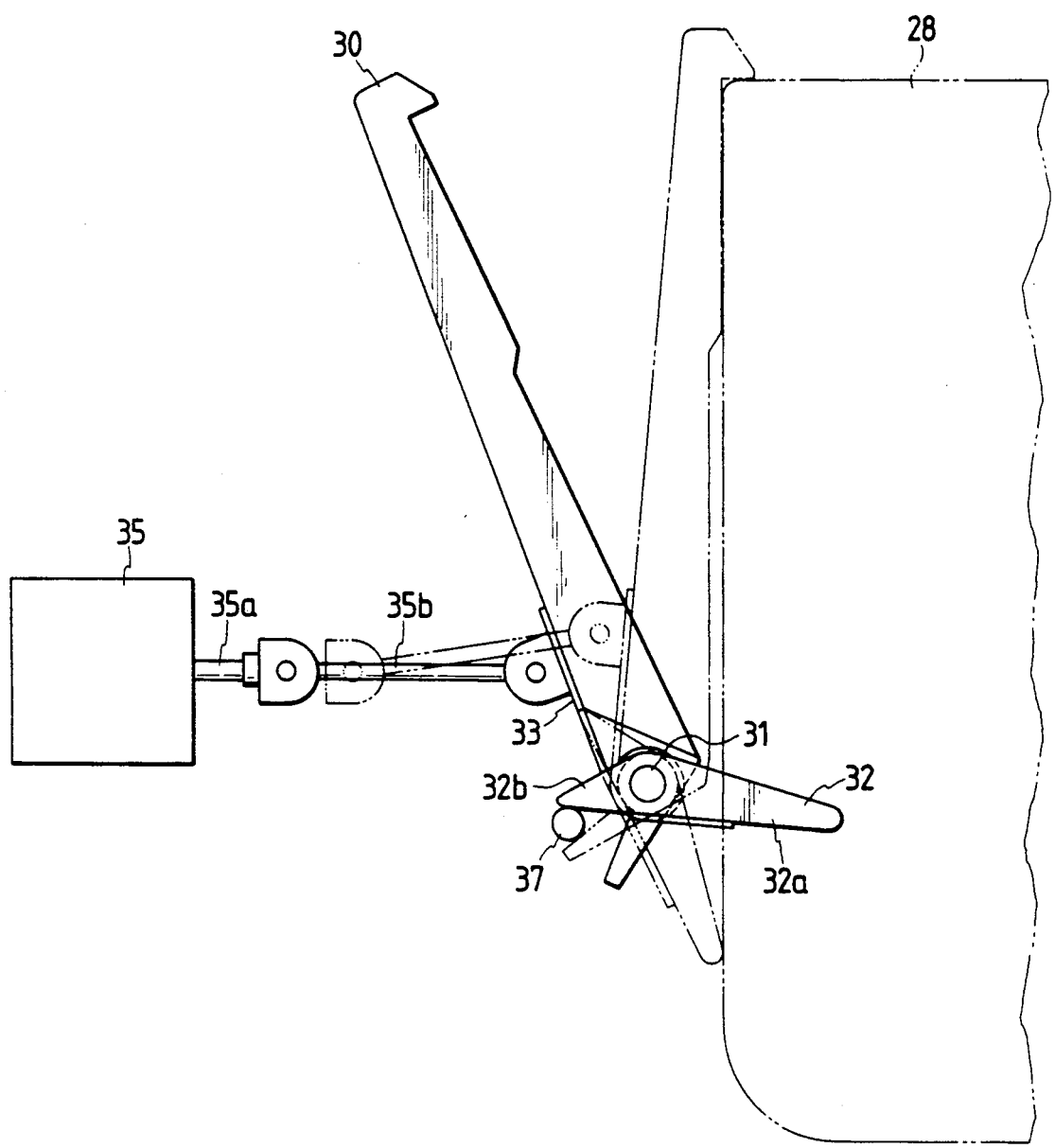
FIG. 5 is a side view showing means for fixing the sheet cartridge at a position, and means for releasing the fixing state according to the present invention.

As best shown in FIG. 5, a fixing arm 30 has a base end portion pivotally supported to the frame of the image recording apparatus by a pivot shaft 31 for fixing the cartridge casing 28 at a position. Further, a stop arm 32 is also pivotally mounted on the pivot shaft 31. The fixing arm 30 and the stop arm 32 are cooperatively movable by a retaining spring 33. The stop arm 32 has a first arm portion 32a contactable with the cartridge casing 28 and a second arm portion contactable with a stop member 37 provided at the frame. The stop member 37 defines a pivotal moving range of the stop arm 32 and the fixing arm 30.

If the cartridge casing 28 is not accommodated in the image recording apparatus, these arms 30 and 32 are positioned as shown by solid lines in FIG. 5. On the other hand, if the cartridge casing 28 is assembled onto the cartridge support means 50, the bottom wall of the casing 28 firstly depresses the stop arm 32 downwardly, and then, the side wall of the casing 28 maintains angular orientation of the stop arm 32 as shown by a dotted chain line in FIG. 5. By the pivotal movement of the stop arm 32, the fixing arm 30 is also pivotally moved because of the biasing force of the retaining spring 33, so that a free end latch is brought into abutment with an upper surface of the cartridge casing 28 as shown by the dotted chain line in FIG. 5.

A solenoid 35 is provided with a plunger rod 35a for forcibly moving the fixing arm 30 to thereby disengage the arm 30 from the cartridge casing 28, to thus allow the casing 28 to be removed from the apparatus. The solenoid 35 can be referred to as cartridge releasing means. For this, a connection rod 36b is pivotally supported by the plunger 35a and the fixing arm 30. When the solenoid is energized, and the plunger 35a is retracted into the solenoid body, the fixing arm 30 is pivotally moved to the solid line position by way of the connection rod 35b against the biasing force of the retaining spring 33. Consequently, the cartridge casing 28 can be taken out of the apparatus.

Figure 6:
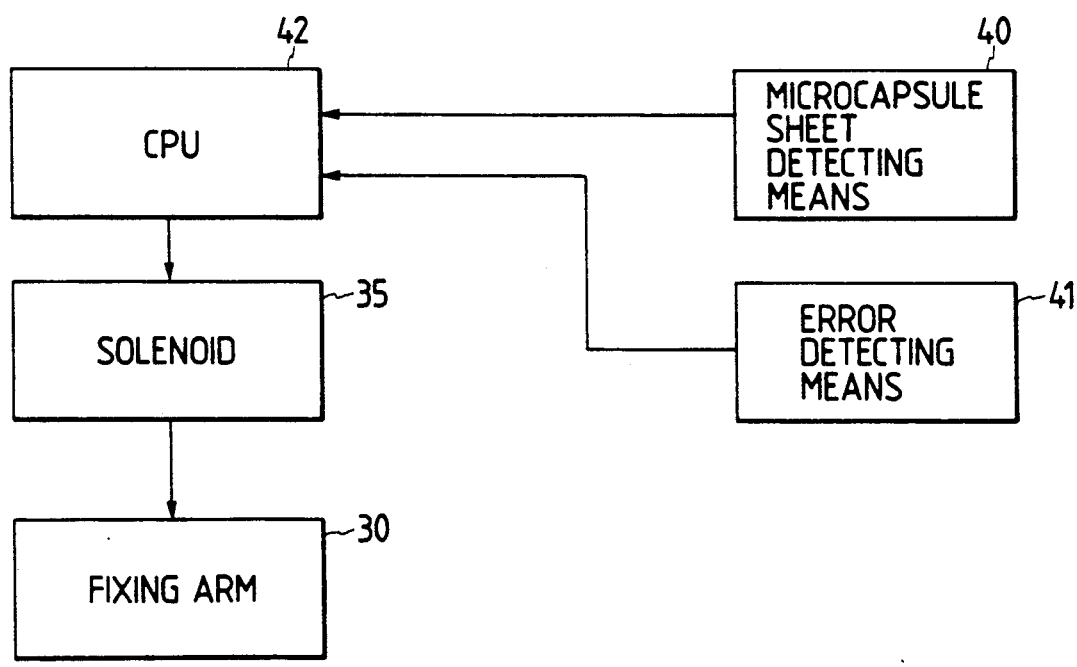
FIG. 6 is a block diagram showing an electrical connection for description of cartridge fixing and releasing means according to this invention.

Further, in this arrangement, an electronic circuit shown in FIG. 6 is provided for providing energization timing of the solenoid 35. More specifically, there is provided means 40 for detecting the image recording medium 13 in the sheet cartridge casing 28. The means 40 generates an output signal indicative of non-existence of the microcapsule sheet 13 in the cartridge casing 28.

Further, error detection means 41 is provided which detects any error or trouble securing in the image recording apparatus. The latter means 41 generates an output signal indicative of the error. The microcapsule sheet detecting means 40 and the error detecting means 41 are connected to a CPU 42 to which the solenoid 35 (cartridge releasing means) is connected. Therefore, only if at least one of the output signals is sent to the CPU, the solenoid 35 is energized to retract the plunger 35a, to thereby pivotally move the fixing arm 30 to the cartridge releasing position shown by the solid line in FIG. 5.

In the image recording apparatus described above, the light exposed microcapsule sheet 13 is wound over the takeup shaft 15. In other words, if predetermined numbers of the copying operations have been carried out, the sheet cartridge 14 is replaced by a new cartridge. However, if usable microcapsule sheet 13 is still rolled in the cartridge casing 28, or if no error or trouble occurs, the detecting means 40 and/or 41 does not generate the output signal. Therefore, the fixing arm 30 still fixes the cartridge casing 28, and consequently, it is impossible to remove the cartridge 14 from the apparatus 100. With this structure, an operator cannot intentionally remove the cartridge 14 from the cartridge support means 50. Accordingly, various disadvantages attendant to the unfavorable removal of the cartridge can be obviated, the disadvantages having been described in the Background of the Invention section.

The sheet cartridge fixing means and releasing means described above are not limited to the above described embodiment, but various modifications may be conceivable so far as performing the relevant function and operation. The cartridge fixing means normally fixes the cartridge 14 at the given position, whereas the cartridge releasing means is only operated upon generation of at least one of the detection signals from the sheet detection means 40 or the error detection means 41. Therefore, the cartridge 14 is normally fixedly supported by the cartridge support means 50 by the fixing means (fixing arm 30). In other words, the cartridge 14 is only removable only when no rolled microcapsule sheet 13 remains in the sheet cartridge casing 28, or only when any error or trouble occurs in the image recording apparatus.

Next, description will be given with respect to a travel of the photosensitive pressure sensitive recording medium or the microcapsule sheet 13 along the sheet path given by the first and second sheet transfer means. In the image recording apparatus, smooth sheet travel is required in order to obtain a desirable output image and to perform successive image recording operations without any time lag which may be caused in sheet jamming or the like.

Figure 7:
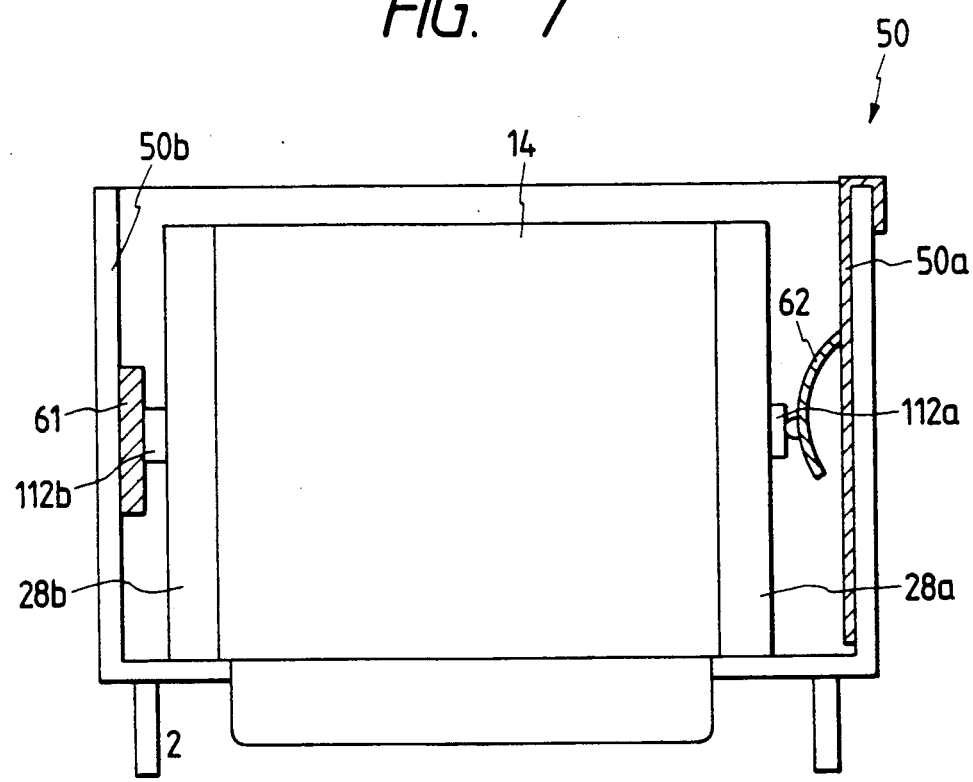
FIG. 7 is a schematic view showing a sheet cartridge according to the present invention.
Figure 8:
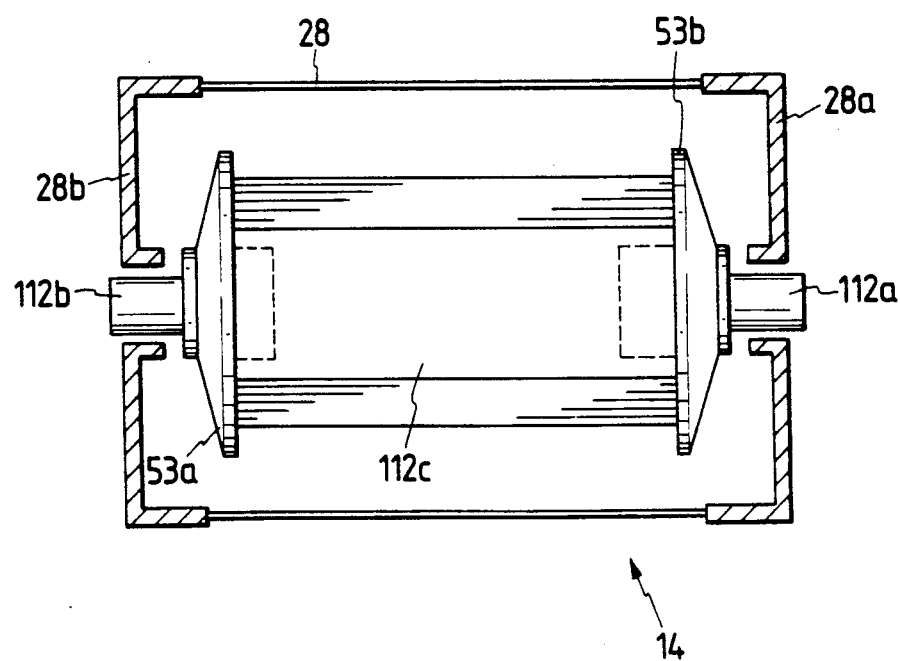
FIG. 8 is a schematic cross-section showing the sheet cartridge and cartridge support means according to the present invention.

For that purpose, an improvement has been made on an internal structure of the sheet cartridge support means 50 and the sheet cartridge 14 as shown in FIGS. 7 and 8. As described above, the photosensitive pressure sensitive recording medium 13 is wound over the supply shaft 112. As best shown in FIG. 8, the supply shaft 112 extends through the side walls of the cartridge casing 28. The supply shaft 112 is constituted by a major shaft portion 112c on which the rolled sheet 13 is rolledly disposed. Further, end portions 112a and 112b are provided which are rotatably supported by the side walls 28a and 28b of the casing 28. A pair of flanges 53a and 53b are mounted on the shaft 112 for regulating winding condition of the microcapsule sheet 13. A distance between the confronting flanges 53a and 53b is set much smaller than a distance between the side walls 28b and 28a of the cartridge casing 28. Therefore, no frictional contact occurs between the flange 53a and the side wall 28a or between the flange 53b and the side wall 28b. Prior to the assembly of the cartridge 14 into the cartridge support means 50, the shaft 112 is freely rotatable about its axis.

As shown in FIG. 7, the cartridge 14 is assembled into the cartridge support means 50 provided in the frame housing of the image recording apparatus. At an inner surface of one of side walls 50b of the support means 50, a high friction member such as a felt member 61 is attached. A distal end face of the supply shaft 112b is in rotational sliding contact with the felt member 61. On the other hand, at an inner surface of another side wall 50a of the support means 50, an urging means such as a leaf spring 62 is provided with which a distal end of the supply shaft 112a is in rotational sliding contact. The urging means urges the supply shaft 112 in an axial direction and toward the high friction member 61. Therefore, the supply shaft 112 is rotatably supported to the cartridge support means 50 by the felt member 61 and the leaf spring 62.

After the sheet cartridge 14 is installed into the cartridge support means 50, the leader portion 113 (FIG. 4) is pulled and the photosensitive pressure sensitive sheet 13 is installed at the proper sheet path. For the copying operation, the sheet 13 is successively drawn out of the cartridge casing 28 through the opening 111a (FIG. 2). In this case, the supply shaft 112 has a given designed axial length, and therefore, deformation amount of the leaf spring 62 is also uniform irrespective of installation of another cartridge 14 into the support means 50. Accordingly, a constant pressure force is applied to the felt member 61, and as a result, a constant braking force is applied to the photosensitive pressure sensitive recording sheet 13. Since the tension applied to the photosensitive sheet 13 is always maintained unchanged because of the uniform braking force given by the pressure contact between the felt member 61 and the distal end face of the shaft 112b, the rolled photosensitive sheet is smoothly travelled along the sheet path. That is, overrunning of the photosensitive sheet 13 is avoided, and slackening of the sheet 13 is also prevented due to less tension applied thereto. Further, any breakage of the sheet 13 is also avoided due to overtension applied thereto. Incidentally, instead of the felt member 61 as the high friction member, synthetic leather is also available. Further, instead of the leaf spring 62 as the urging means, a coil spring or any other biasing means is also available.

Next the sheet transferring mode along the sheet path is also determined by the properties of the sheet transferring means in addition to the braking force given by the cartridge support means 50 described above. Here, attention is drawn to the first sheet transferring means (upstream of the pressure developing unit 19) and particularly to a pair of feed rollers 16 positioned immediately downstream of the sheet cartridge 14. These rollers 16 may undergo transferring thereon of dust or foreign objects from the photosensitive sheet 13, since these rollers 16 are the first components in contact therewith after the sheet 13 is pulled out of the cartridge 14. With the above in mind, in the image recording apparatus according to the present invention, an improvement has been made on the supply rollers 16 and on mechanical components adjacent thereto as shown in FIGS. 1, 9 and 10.

Figure 9:
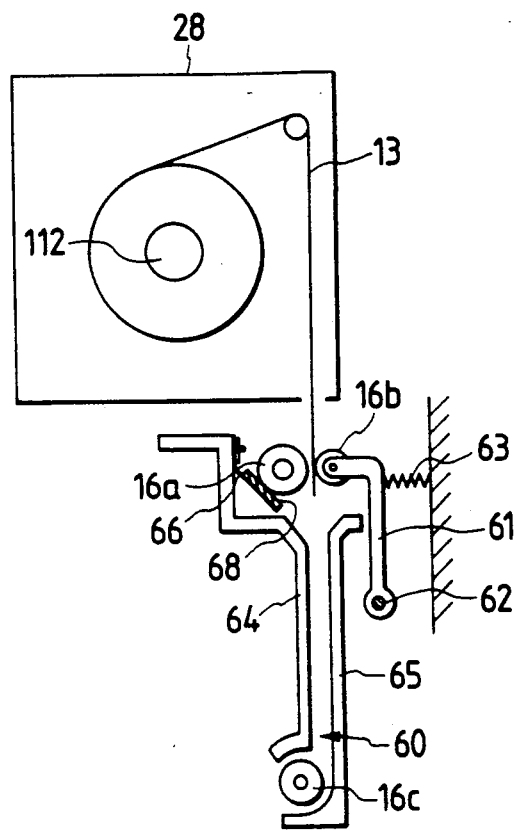
FIG. 9 is a schematic illustration showing the sheet cartridge and subsequent sheet transferring means positioned upstream of a pressure developing unit.
Figure 10:
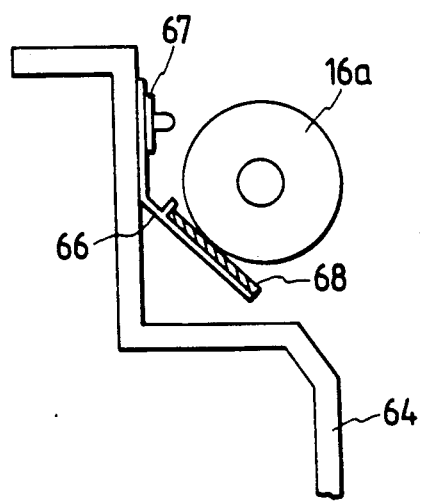
FIG. 10 is an enlarged schematic view for particularly showing sheet transferring means and associated components shown in FIG. 9.
Figure 11:
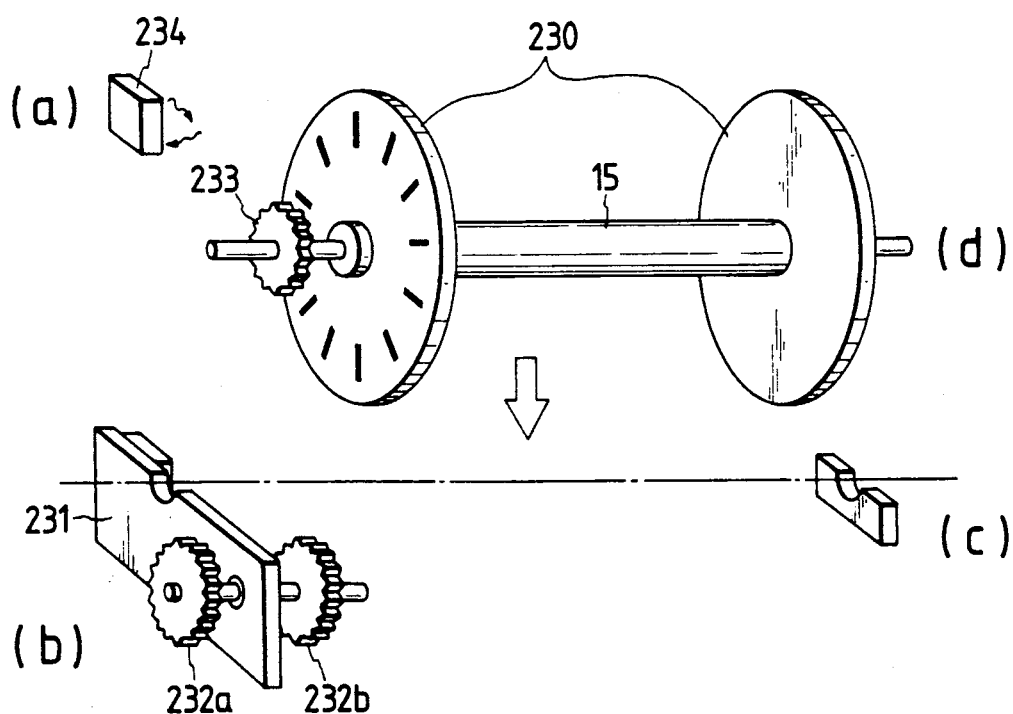
FIG. 11 is a fragmented perspective view showing a takeup shaft and ambient components according to the present invention.

The feed rollers 16 shown in FIG. 1 are shown as a drive roller 16a and a nip roller 16b in FIG. 9. The drive roller 16a has is outer peripheral surface portion formed of a rubber so as to avoid slippage relative to the photosensitive pressure sensitive sheet 13. On the other hand, the nip roller 16b is rotatably supported by one end of a holder 61 whose other end is pivotally supported to the frame of the apparatus by means of a pivot shaft 62. Further, a compression spring 63 is interposed between the frame and the free end of the holder 61, so that the nip roller 16b is urged toward the drive roller 16a. Therefore, the microcapsule sheet 13 delivered from the sheet cartridge 14 is pressed against the drive roller 16a by a proper urging force given by the nip roller 16b.

One sheet path portion is defined by the rollers 16 and roller 16c, and the chutes 64 and 65 each extending between rollers 16 and 16c and in parallel with each other. At a boss portion of one of the chutes 64, a resilient arm member 66 is fixedly secured by means of a push nut 67. Further, a wiper member 68 formed of, for example a felt, is attached to the free end portion of the resilient member 66 so as to remove any dust or foreign objects transferred onto the drive roller 16a from the photosensitive sheet 13. The wiper member 68 is in continuous contact with one portion of the rotating drive roller 16a, the one portion being not in contact with the photosensitive sheet 13.

With such an arrangement, upon actuation of the drive motor 16a, the photosensitive sheet 13 is intermittently delivered to the takeup shaft 15. The sheet 13 is intermittently stopped at the exposure stand 7. After the one outer peripheral portion of the drive roller 16a contacts the photosensitive sheet 13, the one peripheral portion is brought into rotational contact with the wiper member 68. Therefore, dust or foreign objects transferred onto the drive roller 16a from the photosensitive sheet 13 is wiped away by the wiper member 68, and accordingly, dust deposition onto the outer peripheral surface of the drive roller 16a can be avoided. Consequently, the outer peripheral surface of the drive roller 16a can provide a constant frictional coefficient, to thereby properly transfer the photosensitive sheet 13. In this case, the wiper member 68 is resiliently urged by the resilient member 66, and therefore, the wiper member 68 is urged toward the drive roller 16a at the proper depression force. Incidentally, the wiper member 68 and the resilient member 66 can be provided at a position so as to permit the wiper member 68 to be in sliding contact with the other roller such as the roller 16c which constitute the sheet path portion upstream of the pressure developing unit 19.

With the structure, thus organized, since the image recording medium such as the microcapsule sheet 13 is properly transferred because of the maintenance of the proper friction coefficient of the feed roller, various drawbacks can be eliminated such as multiple exposures onto the sheet 13, or disadvantageous sheet consumption due to elongated spacing between neighboring image zones, or positional displacement relative to the developer sheet 17 at the pressure developing unit 19. Further, since the drive roller 16a is always pressed by the wiper member 68 at a constant or proper pressure because of the resilient biasing by the resilient member 66, excessive wearing or damage to the surface of the drive roller 16a is avoided.

Also, attention must be drawn to the sheet transferring mode at the second sheet transferring means (downstream of the pressure developing unit 19). If the photosensitive sheet 13 is improperly transferred by the second sheet transferring means, sheet slackening or jamming may occur as described above. The same is true with respect to the improper winding of the takeup shaft 15. In this connection, FIGS. 11 thru 17 show various embodiments capable of detecting improper sheet transfer at the sheet path downstream of the pressure developing unit 19.

Figure 12:
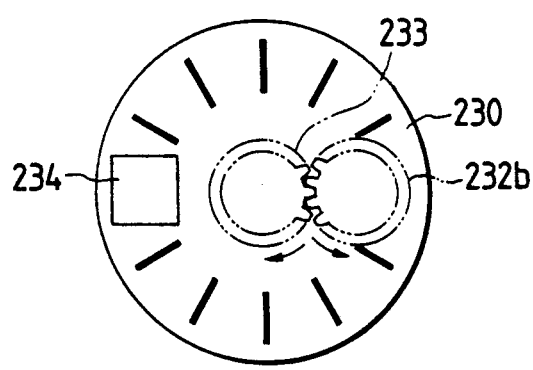
FIG. 12 is a side view showing a flange portion of the takeup shaft according to one embodiment of the present invention.

The takeup shaft 15 according to the present invention is provided with disc like flanges 230 detachable therefrom. One end portion of the takeup shaft 15 is integrally provided with a gear 233 which is meshedly engaged with a gear 232b as shown in FIG. 12 which gear 232b is coaxially mounted on a shaft rotatably supported by a chassis 231 of the housing frame. The gear shaft mounts thereon a gear 232a which is meshedly engaged with a drive source (not shown). Therefore, the takeup shaft 15 is rotatable about its axis upon energization of the drive source through the gears 232a, 232b and 233. At an outer side surface of one of the disc like flanges 230, a radial color pattern are formed. In the illustrated embodiment shown in FIG. 11, radially extending black lines are equi-distantly formed at equal angular intervals. Further, a reflection type photosensor 234 is mounted on the chassis 231 so as to detect the radial pattern.

Upon rotation of the flange 230, the reflection type photosensor 234 reads the pattern, so that rotation of the takeup shaft 15 is acknowledged. It should be noted that in the situation where the takeup shaft 15 is not rotated while the various components in the first sheet transferring section (upstream of the pressure developing unit 19) are rotated, sheet slackening occurs in the second sheet transferring section (downstream of the pressure developing unit 19). Therefore, in the illustrated embodiment, the photosensor 234 detects non-rotation of the takeup shaft 15 and such malfunction is displayed. Accordingly, an operator can recognize the malfunction, and can stop the copying operation.

Figure 13:
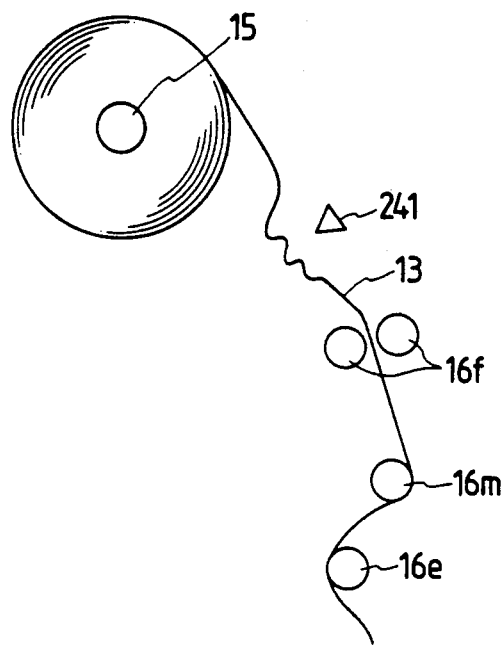
FIG. 13 is a schematic illustration showing a takeup shaft and sheet transferring means according to one modification of this invention.

In the illustrated embodiment, the reflection type photosensor 234 is used. However, a transmissive type optical sensor or a magnetic sensor is also available so far as these sensor can detect rotation of the takeup shaft 15. Further, in the illustrated embodiment, rotation of the takeup shaft 15 is directly detected by detecting the rotation of the disc like flange 230 so as to detect sheet slacking at the second sheet transferring section. However, non-rotation of the takeup shaft 15 can be indirectly detected by detecting a sheet slackening occurring between the takeup shaft 15 and the feed roller 16e as shown in FIG. 13. The sheet slacking can be detected by providing a tension sensor 241 at a sheet path between the takeup shaft 15 and the feed roller 16e.

Figure 14A:
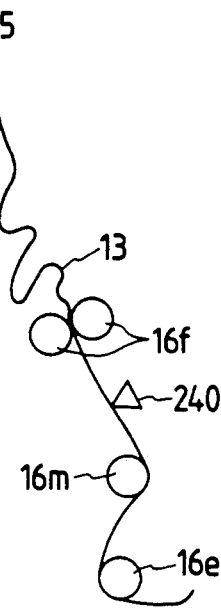
FIG. 14(a) is a schematic illustration showing a takeup shaft and sheet transferring means according to another modification of this invention.
Figure 14B:
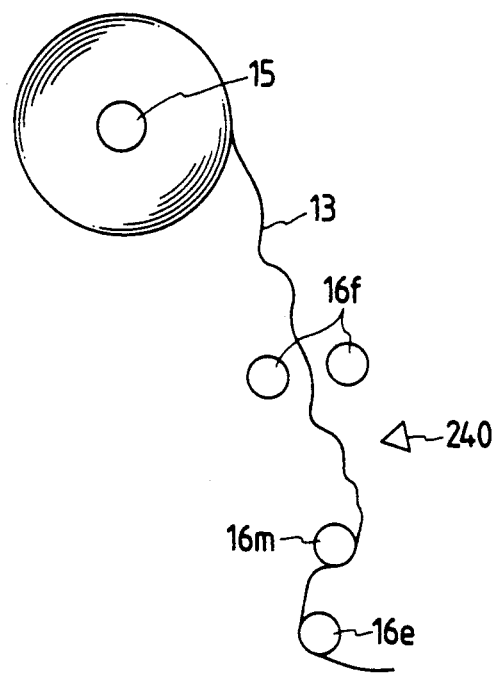
FIG. 14(b) is a schematic illustration showing the another modification in which sheet feed rollers release sheet nipping therebetween.
Figure 15:
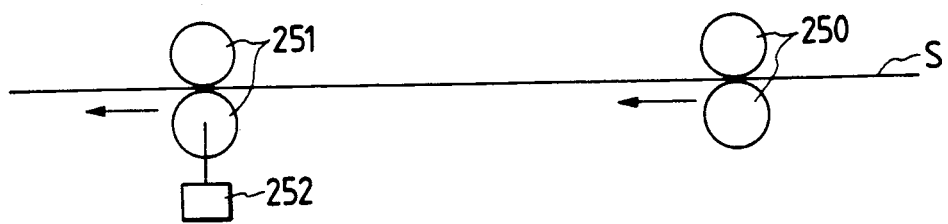
FIG. 15 is a schematic view for description of one mode for detecting a sheet slack in the present invention.

Further, in another modification, as shown in FIGS. 14(a) and 14(b), a tension sensor 240 is provided at a sheet path between the feed rollers 16f and the meandering travel control roller 16m. In the sheet nipping state by the opposing feed rollers 16f, the sheet slackening which occurs due to the non-rotation of the takeup shaft may not be detected, as far as the feed rollers 16f and the roller 16m are regularly rotated as shown in FIG. 14(a). However, if releasing one of the feed rollers from the opposing roller 16f, the sheet slack is propagated at the sheet path zone between the rollers 16f and the roller 16m as shown in FIG. 14(b). Therefore, the tension sensor 40 cannot be any more detect the tensile state of the sheet 13. By such arrangement, abnormality of the takeup shaft 15 can also be detected. To attain this detection, one of the feed rollers 16f is moved away from the remaining feed roller 16f one second after the pressure developing operation. The roller moving mechanism per se has been known, and therefore, detailed description can be neglected.

Furthermore, the concept of detection of the sheet slacking in the sheet transferring path can be applied to an ordinary sheet feeding roller arrangement. For example, an arrangement shown in FIG. 15 corresponds to the embodiment shown in FIG. 11. That is, a first roller group 250 is provided for feeding out the sheet S in a direction indicated by an arrow, and a second roller group 251 is provided for transferring the sheet S which has been fed by the first roller group 250. A rotation sensor 252 is provided at the second roller group so as to detect the rotation of the second roller group 251.

Figure 16:
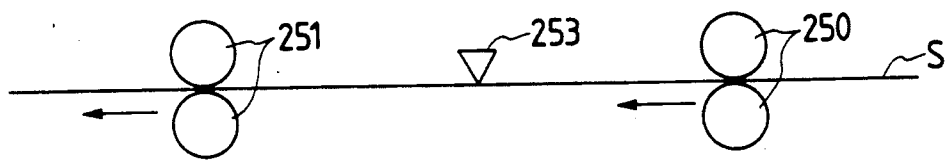
FIG. 16 is a schematic view for description of another mode for detecting a sheet slack in the present invention.
Figure 17:
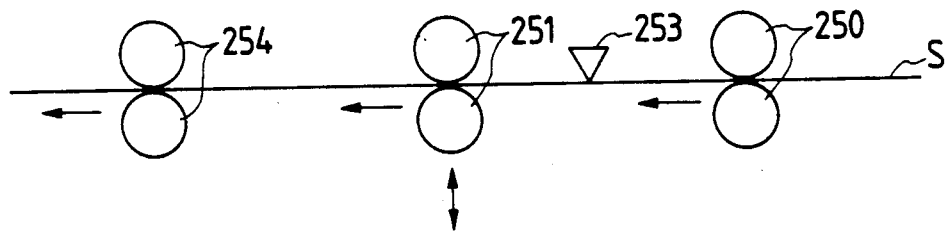
FIG. 17 is a schematic view for description of still another mode for detecting a sheet slack in the present invention.

On the other hand, an arrangement shown in FIG. 16 corresponds to the embodiment shown in FIG. 14. In this arrangement, a tension sensor 253 is positioned at a sheet path between the first and second roller groups 250 and 251. Further, an arrangement shown in FIG. 17 correspond to the embodiment shown in FIGS. 14(a) and 14(b). This arrangement include additional roller group 254 provided at a downstream side of the second roller group 251 of the second arrangement shown in FIG. 16. If a nipping state of the second roller group 251 is released, the rotational condition of the third roller group 254 is detected by the tension sensor 253 positioned between the first and second roller groups 250 and 251. The third arrangement is particularly effective since, normally, the sheet jamming is cleared by releasing the nipping state of the rollers. Moreover, the tension sensor 253 used in the third arrangement can be positioned between the second and the third roller groups 251 and 254. The sheet nipping state of the second roller group 251 is released so as to propagate the sheet slackening occurring downstream of the second roller group 251 into the sensor position in the third arrangement. Therefore, for the detection, the second roller group 251 can be of inertia free state.

As described above, even if the takeup shaft 15 is not rotated so that the sheet slackening occurs, such sheet slackening or non-rotation of the shaft 15 is detected even at an initial start up period of copying operation. Therefore, sheet jamming can be obviated, and maintenance to the sheet path can be effected at an early stage of the sheet slackening.

While the invention has been described in detail and with reference to specific embodiments thereof, it would be apparent to those skilled in the art that various changes and modifications can be made therein without departing from the spirit and scope of the invention.

What is claimed is:

1. An image recording apparatus for recording an image on an image recording medium, the image corresponding to an image of an original, the image recording apparatus comprising:
   a frame;
   a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for winding therearound the light exposed image recording medium; and a second sheet transferring means defining a second sheet path for feeding the image recording medium to the takeup means; wherein the retaining means comprises:

locking means foldable into two halves and sandwiching the leading end portion of the image recording medium for connecting the halves to the medium in its folding state, the locking means providing a folded edge line; and light shielding means provided integral with the locking means, the folded edge line being positioned ahead of the shielding means with respect to a running direction of the image recording medium along the first sheet path.

2. The image recording apparatus as claimed in claim 1, wherein the folded halves comprise first and second plate sections, and wherein the retaining means further comprises a manipulating means provided at both the first and second plate sections positioned ahead of the light shielding means, the manipulating means comprising a first projection provided at the first plate section and extending through the second plate section, and a second projection provided at the second plate section and extending through the first plate section.

3. The image recording apparatus as claimed in claim 1, wherein the image recording medium comprises a photosensitive pressure sensitive image recording medium, and a developer medium, the retaining means holding a leading end portion of the photosensitive pressure sensitive recording medium accommodated in the cartridge casing.

4. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for winding therearound the light exposed image recording medium;

a second sheet transferring means defining a second sheet path for feeding the image recording medium to the takeup means;

fixing means for fixing the sheet cartridge casing at a position, the fixing means being supported by the frame;

releasing means for moving the fixing means to remove the sheet cartridge casing from the frame;

a first detecting means for detecting non-existence of the rolled image recording medium in the cartridge casing, the first detecting means generating a first output signal indicative of the non-existence of the image recording medium in the cartridge casing; and control means for actuating the releasing means in response to the first output signal.

5. The image recording apparatus as claimed in claim 4, further comprising a second detecting means for detecting any malfunction occurring in the image recording apparatus, the second detecting means generating a second output signal indicative of the malfunction; the control means actuating the releasing means in response to at least one of the first and second output signals.

6. The image recording apparatus as claimed in claim 4 wherein the fixing means comprises a pivot arm pivotally supported by the frame and engageable with the cartridge casing; and wherein the releasing means comprises a solenoid connected to the pivot arm.

7. The image recording apparatus as claimed in claim 4, wherein the image recording medium comprises a photosensitive pressure sensitive recording medium and a developer medium, the latent image being formed on the photosensitive pressure sensitive recording medium and the visible image being formed on the developer medium.

8. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, retaining means connectable to a leading end portion of the image recording medium to avoid retraction of the medium into the cartridge casing and for covering the opening and a supply shaft rotatably supported by the cartridge casing and extending therethrough, the supply shaft having a first distal end face and a second distal end face, the image recording medium being wound over the supply shaft in the rolled state;

a cartridge support means provided at the frame, the cartridge support means comprising:

a first wall having a first inner surface;

a second wall having a second inner surface;

a friction member provided at the first inner surface, the first distal end face being in frictional contact with the friction member; and an urging member disposed at the second inner surface, the second distal end face being in contact with the urging member for urging the supply shaft in its axial direction toward the friction member;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for winding therearound the light exposed image recording medium; and a second sheet transferring means defining a second sheet path for feeding the image recording medium to the takeup means.

9. The image recording apparatus as claimed in claim 8, wherein the image recording medium comprises a photosensitive pressure sensitive recording medium wound over the supply shaft, and a separate developer medium superposed on the photosensitive pressure sensitive recording medium at the pressure developing unit.

10. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit and including a drive roller and a nip roller for pulling out the image recording medium from the sheet cartridge and for introducing and feeding the medium into and along the first sheet path;

a takeup means for winding therearound the light exposed image recording medium;

a second sheet transferring means defining a second sheet path for feeding the image recording medium to the takeup means;

a chute means which defines a part of the first sheet path;

a resilient member attached to the chute means; and a wiper member attached to the resilient member, the drive roller being in rolling slide contact with the wiper member.

11. The image recording apparatus as claimed in claim 10, wherein the resilient member has a base end attached to the chute means and a free end portion on which the wiper member is attached, the wiper member being urged toward the drive roller by the resilient member, and the wiper member being in sliding contact with an outer peripheral part of the drive roller, the part being different from a part in rolling contact with the image recording medium.

12. The image recording apparatus as claimed in claim 10, wherein the image recording medium comprises a photosensitive pressure sensitive recording medium and a developer medium, the drive roller and the nip roller interposing the photosensitive pressure sensitive recording medium therebetween to feed the photosensitive pressure sensitive medium toward the pressure developing unit.

13. The image recording apparatus as claimed in claim 1, further comprising a sensor means provided at one of a portion adjacent to the takeup means and the second sheet path defined by the second sheet transferring means for detecting malfunction of one of the takeup shaft and the second sheet transferring means.

14. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for winding therearound the light exposed image recording medium;

a second sheet transferring means defining a second sheet path for feeding the image recording medium to the takeup means; and sensor means provided at one of a portion adjacent to the takeup means and the second sheet path defined by the second sheet transferring means for detecting malfunction of one of the takeup means and the second sheet transferring means wherein the sensor means comprises a rotation sensor for detecting a rotation state of the takeup means, the rotation sensor being positioned adjacent to the takeup means.

15. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for widening therearound the light exposed image recording medium;

a second sheet transferring means defining a second sheet path for feeding the image recording medium to the takeup means; and sensor means provided at one of a portion adjacent to the takeup means and the second sheet path defined by the second sheet transferring means for detecting malfunction of one of the takeup means and the second sheet transferring means;

wherein the second sheet transferring means comprises a pair of feed rollers positioned immediately upstream of the takeup means, the sensor means comprising a tension sensor positioned at a part of the second sheet path between the takeup means and the pair of feed rollers for detecting a sheet slack occurring between the takeup means and the pair of feed rollers.

16. An image recording apparatus for recording an image on an image recording medium, the image corresponding to an image of an original, the image recording apparatus comprising:

a frame;

a sheet cartridge detachably mounted on the frame, the sheet cartridge accommodating therein a rolled image recording medium, the sheet cartridge comprising a cartridge casing formed with an opening, and retaining means connectable to a leading end portion of the image recording medium to avoid retraction of the medium into the cartridge casing and for covering the opening;

an exposure stand positioned downstream of the sheet cartridge and at which a part of the image recording medium is exposed to light for providing a latent image corresponding to the image of the original;

a pressure developing unit positioned downstream of the exposure stand for pressure developing the latent image and for providing a visible image;

a first sheet transferring means defining a first sheet path for feeding the image recording medium to the pressure developing unit;

a takeup means for winding therearound the light exposed image recording medium;

a second sheet transferring means defining a second sheet path for feeding the image recording medium to the takeup means; and sensor means provided at one of a portion adjacent to the takeup means and the second sheet path defined by the second sheet transferring means for detecting malfunction of one of the takeup means and the second sheet transferring means;

wherein the second sheet transferring means comprises a pair of feed rollers positioned immediately upstream of the takeup means, and another roller positioned immediately upstream the pair of feed rollers, at least one of the rollers of the pair of feed rollers being movable toward and away from each other for selectively releasing sheet nipping, and wherein the sensor means comprises a tension sensor positioned between a part of the second sheet path between the pair of feed rollers and the another roller, the tension sensor detecting a sheet slack which propagates between the pair of feed rollers and the another roller upon moving at least one of the feed rollers away from the remaining feed roller.

17. A sheet cartridge which stores therein a rolled photosensitive recording medium, the recording medium having a leading end portion and being fed out of the cartridge along a sheet path, the cartridge comprising a cartridge casing for accommodating therein the rolled photosensitive recording medium, the casing being formed with an opening through which the photosensitive recording medium is drawn out of the casing; and retaining means connectable to the leading end portion of the image recording medium to avoid retraction of the medium into the cartridge casing and for covering the opening, the retaining means comprising:

locking means foldable into two halves and sandwiching the leading end portion of the image recording medium for connecting the halves to the medium in its folding state, the locking means providing a folded edge line; and light shielding means provided integral with the locking means, the folded edge line being positioned ahead of the shielding means with respect to a running direction of the image recording medium along the sheet path.

18. The sheet cartridge as claimed in claim 17, wherein the folded halves comprise first and second plate sections, and wherein the retaining means further comprises a manipulating means provided at both the first and second plate sections positioned ahead of the light shielding means, the manipulating means comprising a first projection provided at the first plate section and extending through the second plate section, and a second projection provided at the second plate section and extending through the first plate section.

19. An image recording apparatus provided with a frame and a sheet cartridge which includes a cartridge casing in which a rolled image recording medium is accommodated, the apparatus comprising:

fixing means for fixing the sheet cartridge casing at a position, the fixing means being supported by the frame;

releasing means for moving the fixing means to remove the sheet cartridge casing from the frame;

a first detecting means for detecting non-existence of the rolled image recording medium in the cartridge casing, the first detecting means generating a first output signal indicative of the non-existence of the image recording medium in the cartridge casing; and control means for actuating the releasing means in response to the first output signal.

20. The image recording apparatus as claimed in claim 19, comprising a second detecting means for detecting any malfunction occurring in the image recording apparatus, the second detecting means generating a second output signal indicative of the malfunction; the control means actuating the releasing means in response to at least one of the first and second output signals.

21. The image recording apparatus as claimed in claim 19, wherein the fixing means comprises a pivot arm pivotally supported by the frame and engageable with the cartridge casing; and wherein the releasing means comprises a solenoid connected to the pivot arm.

22. The image recording apparatus as claimed in claim 19, wherein the image recording medium comprises a photosensitive pressure sensitive recording medium and a developer medium, the cartridge casing accommodating therein the photosensitive pressure sensitive recording medium.

23. An image recording apparatus comprising;
a frame;
a sheet cartridge for accommodating therein a rolled image recording medium; the cartridge comprising a cartridge casing, a supply shaft rotatably supported by the cartridge casing and extending therethrough, the supply shaft having a first distal end face and a second distal end face, the image recording medium being wound over the supply shaft in the rolled state; and
a cartridge support means provided at the frame, the cartridge support means comprising a first wall having a first inner surface; a second wall having a second inner surface: a friction member provided at the first inner surface, the first distal end face being in frictional contact with the friction member; and a resilient urging member disposed at the second inner surface, the second distal end face being in contact with the resiliently urging member for urging the supply shaft in its axial direction toward the friction member.

24. The image recording apparatus as claimed in claim 23, wherein the image recording medium comprises a photosensitive pressure sensitive recording medium wound over the supply shaft.

25. An image recording apparatus comprising,
a sheet cartridge in which a rolled image recording medium is accommodated;
a pressure developing unit positioned downstream the sheet cartridge;
a first sheet transferring means which define a first sheet path and positioned between the sheet cartridge and the pressure developing unit, the first sheet transferring means comprising a drive roller and a nip roller for pulling out the image recording medium from the sheet cartridge and for introducing and feeding the medium into and along the first sheet path;
a chute means which defines a part of the first sheet path;
a resilient member attached to the chute means; and
a wiper member attached to the resilient member, the drive roller being in rolling slide contact with the wiper member.

26. The image recording apparatus as claimed in claim 25, wherein the resilient member has a base end attached to the chute means and a free end portion on which the wiper member is attached, the wiper member being urged toward the drive roller by the resilient member, and the wiper member being in sliding contact with an outer peripheral part of the drive roller, the part being different from a part in rolling contact with the image recording medium.

27. The image recording apparatus as claimed in claim 25, wherein the image recording medium comprises a photosensitive pressure sensitive recording medium and a developer medium, the drive roller and the nip roller interposing the photosensitive pressure sensitive recording medium therebetween to feed the photosensitive pressure sensitive medium toward the pressure developing unit.

* * * * *